(12) United States Patent
Wang

(10) Patent No.: US 8,338,235 B2
(45) Date of Patent: Dec. 25, 2012

(54) PACKAGE PROCESS OF STACKED TYPE SEMICONDUCTOR DEVICE PACKAGE STRUCTURE

(75) Inventor: Meng-Jen Wang, Pingtung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 224 days.

(21) Appl. No.: 12/766,549

(22) Filed: Apr. 23, 2010

(65) Prior Publication Data
US 2011/0195545 A1 Aug. 11, 2011

(30) Foreign Application Priority Data
Feb. 11, 2010 (TW) .............................. 99104480 A

(51) Int. Cl.
*H01L 21/00* (2006.01)
(52) U.S. Cl. ........ 438/113; 438/107; 438/108; 438/109; 438/112; 257/700; 257/723
(58) Field of Classification Search .................. 257/723, 257/700; 438/113, 107–109, 112
See application file for complete search history.

(56) References Cited

U.S. PATENT DOCUMENTS

| | | | | |
|---|---|---|---|---|
| 5,786,628 A * | 7/1998 | Beilstein et al. | ............. | 257/684 |
| 6,424,034 B1 * | 7/2002 | Ahn et al. | ............. | 257/723 |
| 6,524,885 B2 * | 2/2003 | Pierce | ............. | 438/106 |
| 6,746,938 B2 * | 6/2004 | Uchiyama et al. | ............. | 438/459 |
| 6,809,421 B1 * | 10/2004 | Hayasaka et al. | ............. | 257/777 |
| 7,064,005 B2 * | 6/2006 | Takaoka | ............. | 438/108 |
| 7,189,595 B2 * | 3/2007 | Magerlein et al. | ............. | 438/108 |
| 7,247,517 B2 * | 7/2007 | Rumer et al. | ............. | 438/107 |
| 7,388,277 B2 * | 6/2008 | Pogge et al. | ............. | 257/621 |
| 7,553,752 B2 * | 6/2009 | Kuan et al. | ............. | 438/613 |
| 7,696,004 B2 * | 4/2010 | Yuan et al. | ............. | 438/106 |
| 7,700,957 B2 * | 4/2010 | Bieck et al. | ............. | 257/82 |
| 7,728,439 B2 * | 6/2010 | Nishiyama et al. | ............. | 257/778 |
| 7,799,613 B2 * | 9/2010 | Dang et al. | ............. | 438/121 |
| 7,883,991 B1 * | 2/2011 | Wu et al. | ............. | 438/459 |
| 7,919,410 B2 * | 4/2011 | England et al. | ............. | 438/667 |
| 8,008,762 B2 * | 8/2011 | Bolken et al. | ............. | 257/680 |
| 8,067,308 B2 * | 11/2011 | Suthiwongsunthorn et al. | ............. | 438/618 |
| 2006/0151870 A1 * | 7/2006 | Nishiyama et al. | ............. | 257/700 |
| 2007/0184583 A1 * | 8/2007 | Egawa | ............. | 438/113 |
| 2009/0102002 A1 * | 4/2009 | Chia et al. | ............. | 257/433 |
| 2009/0212420 A1 * | 8/2009 | Hedler et al. | ............. | 257/737 |
| 2009/0261460 A1 * | 10/2009 | Kuan et al. | ............. | 257/660 |

* cited by examiner

*Primary Examiner* — David Vu
*Assistant Examiner* — Caleb Henry
(74) *Attorney, Agent, or Firm* — J.C. Patents

(57) ABSTRACT

A package process is provided. The package process includes: disposing a semiconductor substrate on a carrier, wherein the semiconductor substrate has plural contacts at a side facing the carrier; thinning the semiconductor substrate from a back side of the semiconductor substrate and then forming plural through silicon vias in the thinned semiconductor substrate; forming plural first pads on the semiconductor substrate, wherein the first pads respectively connected to the through silicon vias; bonding plural chips to the semiconductor substrate, wherein the chips are electrically connected to the corresponding pads; forming a molding compound on the semiconductor substrate to cover the chips and the first pads; separating the semiconductor substrate and the carrier and then forming plural solder balls on the semiconductor substrate; and sawing the molding compound and the semiconductor substrate.

8 Claims, 22 Drawing Sheets

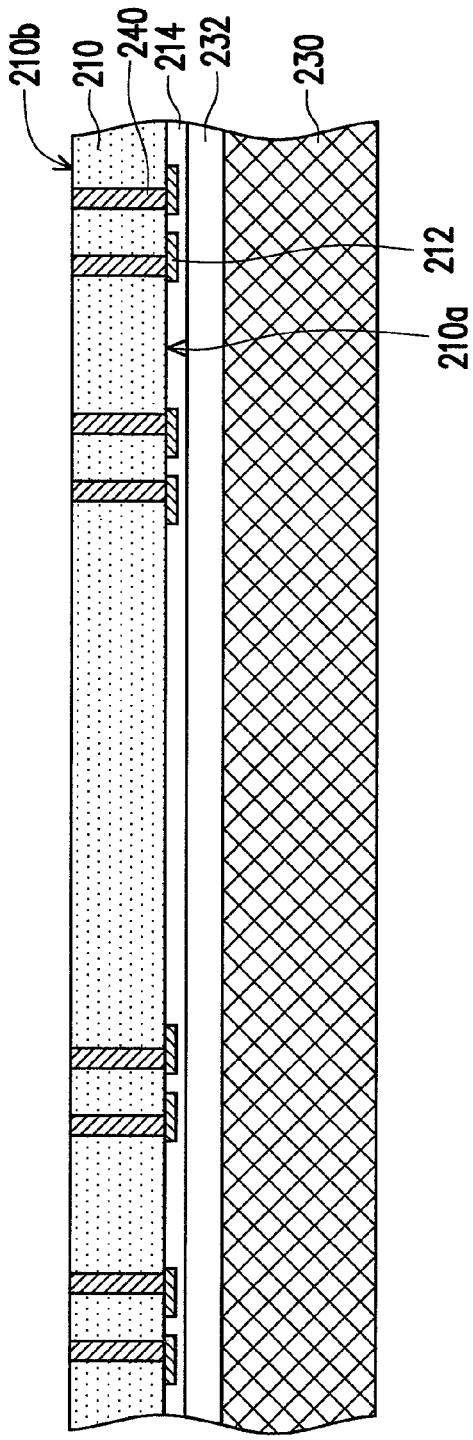
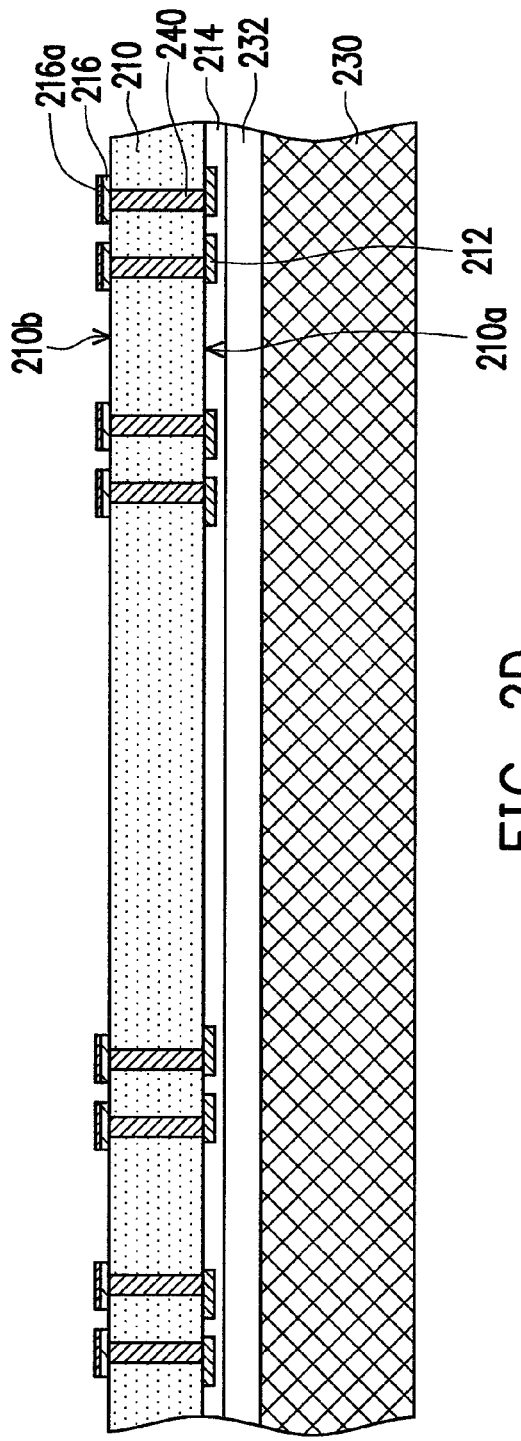
FIG. 2C
FIG. 2D

PACKAGE PROCESS OF STACKED TYPE SEMICONDUCTOR DEVICE PACKAGE STRUCTURE

CROSS-REFERENCE TO RELATED APPLICATION

This application claims the priority benefit of Taiwan application serial no. 99104480, filed on Feb. 11, 2010. The entirety of the above-mentioned patent application is hereby incorporated by reference herein and made a part of this specification.

BACKGROUND OF THE INVENTION

1. Field of the Invention

The present invention relates to a package structure, in particular, to a stacked type semiconductor device package structure.

2. Description of Related Art

In today's information society, users all seek electronic products with high speed, high quality and multiple functions. In terms of the product exterior appearance, electronic product designs reveal a trend of light weight, thinness and compactness. Therefore, various semiconductor device package techniques such as stacked-type stacked type semiconductor device package technique are proposed.

In the stacked-type semiconductor device package technique, several semiconductor devices are perpendicularly stacked together to form a package structure so that the package density is improved and the dimension of the package is decreased. Furthermore, by using three-dimensional stacking method to decrease the path length of the signal transmission between the semiconductor devices, rate of the signal transmission is improved and the semiconductor devices with different functions can be combined in the same package.

A conventional stacked-type semiconductor device package technique stacks chips on a wafer carrier having through silicon vias (TSV) to perform a wafer level package, and cutting off the wafer carrier with a molding compound thereon to form plural individual package units. Each of the individual package units may be connected to an external circuit board through solder balls formed on the bottom surface of the wafer.

However, the conventional stacked-type semiconductor device package technique first forms the solder balls on the bottom surface of the wafer, and then directly disposes the wafer carrier with the solder balls on the carrier and embeds the solder balls into an adhesive layer on the carrier. And, after the steps of a wafer level package is completed and the wafer carrier and the carrier are separated, the solder balls on the bottom surface of the wafer carrier are exposed. Therefore, when a solder ball having a larger size is formed on the bottom surface of the wafer carrier, it is difficult to firmly bond the solder ball in large size to the adhesive layer on the carrier, and thus the reliability of the package process is inferior.

SUMMARY OF THE INVENTION

The present invention is directed to a package process capable of effectively preventing an issue of the reliability of the package process due to a bad bonding, which is caused by using a solder ball having a larger size, between the wafer carrier and the carrier.

To embody the present invention, a package process is provided as follows. A semiconductor substrate is disposed on a carrier, wherein the semiconductor substrate has a first surface facing the carrier and plural contacts on the first surface. The semiconductor substrate is thinned from a back side of the semiconductor substrate in opposite to the first surface, wherein the thinned semiconductor substrate has a second surface opposite to the first surface. Plural through silicon vias are formed in the thinned semiconductor substrate. The through silicon vias respectively correspond to and connect to the contacts. Plural first pads are formed on the second surface of the semiconductor substrate, wherein the first pads respectively correspond to and connect to the through silicon vias. Plural chips are bonded to the second surface of the semiconductor substrate, wherein the chips respectively electrically connect to the corresponding first pads. A molding compound is formed on the second surface of the semiconductor substrate, wherein the molding compound covers the chips and the first pads. The semiconductor substrate and the carrier are separated, and plural solder balls are formed on the first surface of the semiconductor substrate, wherein the solder balls respectively electrically connect to the corresponding contacts. And, the molding compound and the semiconductor substrate are simultaneously sawed to form a plurality of package units.

In one embodiment of the prevent invention, the aforementioned package process further comprises forming a redistribution layer on the first surface of the semiconductor substrate before the semiconductor substrate is disposed on the carrier. A surface of the redistribution layer has plural second pads and the second pads respectively electrically connect to the contacts. Additionally, the aforementioned package process further comprises forming an under bump metallurgy layer on each of the second pads.

In one embodiment of the prevent invention, the aforementioned package process further comprises forming a redistribution layer on the first surface of the semiconductor substrate after the semiconductor substrate and the carrier are separated and before the solder balls are formed on the first surface of the semiconductor substrate. A surface of the redistribution layer has plural second pads and the second pads respectively electrically connect to the contacts. Additionally, the aforementioned package process further comprises forming an under bump metallurgy layer on each of the second pads.

In one embodiment of the prevent invention, the aforementioned package process further comprises forming an under bump metallurgy layer on each of the first pads.

In one embodiment of the prevent invention, the aforementioned step of bonding the chips to the second surface of the semiconductor substrate includes bonding each of the chips to the corresponding first pads through plural conductive bumps by a flip chip bonding technology.

In one embodiment of the prevent invention, the aforementioned package process further comprises forming an underfill between each of the chips and the semiconductor substrate after the chips are bonded to the second surface of the semiconductor substrate and before the molding compound is formed on the second surface of the semiconductor substrate, wherein the underfill encapsulates the conductive bumps.

As described above, in the embodiment of the prevent invention, the semiconductor substrate first is disposed on the carrier, and the solder balls are formed on the first surface of the semiconductor substrate after the wafer level package is completed and the semiconductor substrate and the carrier are separated. Therefore, the present invention can effectively prevent the bad bonding, which is caused by using a solder ball having a larger size, between the wafer carrier and the carrier, thereby increasing the reliability of the package process.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A~2K illustrate a package process according to another embodiment of the present invention.

DESCRIPTION OF EMBODIMENTS

Compared to the conventional stacked-type semiconductor device package technique, in which the solder balls first are formed on the bottom surface of the wafer carrier, and then the wafer carrier with the solder balls is disposed on the carrier such that the solder balls are embedded into the adhesive layer on the carrier, in the invention, the semiconductor substrate is bonded to the carrier, and the solder balls are formed on the first surface of the semiconductor substrate after the wafer level package has completed and the semiconductor substrate and the carrier are separated. In the following, several embodiments are provided to explain the package processes in the present invention.

FIGS. 1A~1K illustrate a package process according to an embodiment of the present invention.

Figure 1A:
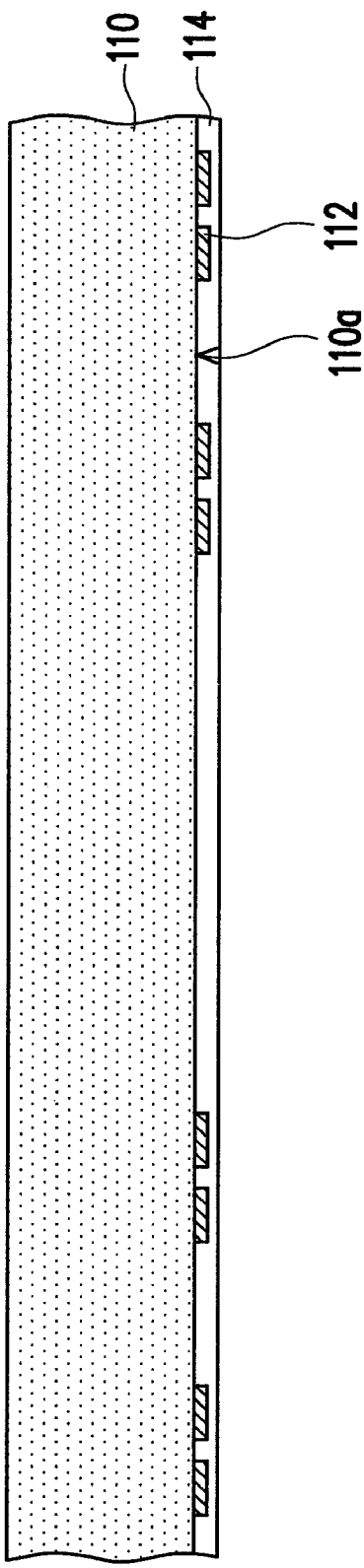
FIGS. 1A~1K illustrate a package process according to an embodiment of the present invention.

First, referring to FIG. 1A, a semiconductor substrate 110 is provided. The semiconductor substrate may be a silicon wafer substrate or other semiconductor material substrate. The semiconductor substrate 110 has a first surface 110a and a plurality of contacts 112 on the first surface 110a. An interconnect structure may be fabricated inside the semiconductor substrate 110, or active or passive devices (not shown) may be embedded into the semiconductor substrate 110 according to a conventional technique. Additionally, the first surface 110a of the semiconductor substrate 110 may be covered by a passivation layer 114 for protecting the contacts 112.

It should be noted that the semiconductor substrate 110 of the prevent embodiment is used for a carrier of a wafer level package and may be packaged with one or more chips. However, because it is limited to the size of the drawings, only a portion of the semiconductor substrate 110 is shown in the present embodiment.

Figure 1B:
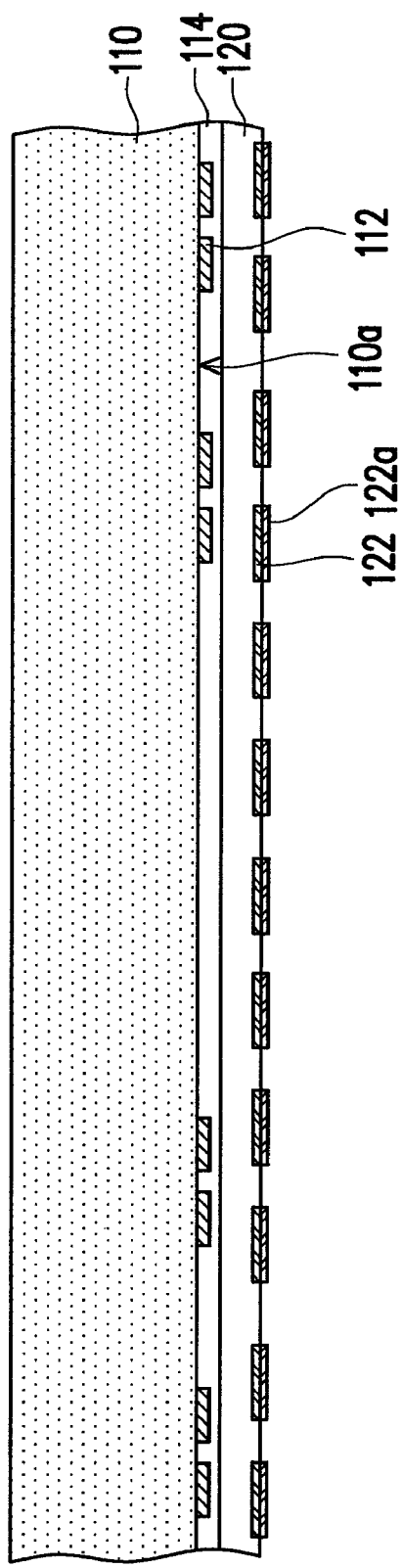

Then, as shown in FIG. 1B, in some situations, a redistribution layer 120 may be formed selectively on the first surface 110a of the semiconductor substrate 110, i.e., the passivation layer 114. A surface of the redistribution layer 120 has plural second pads 122, and the second pads 122 electrically connect to the contacts 112 on the first surface 110a of the semiconductor substrate 110 through internal circuits inside the redistribution layer 120, respectively, for re-adjusting positions of external contacts of the semiconductor substrate 110. Herein, an under bump metallurgy layer (UBM layer) 122a may be formed on the second pads 112 for increasing an attachment effect between solder balls, which are formed subsequently, and the second pads 122.

The following steps in the embodiment will be explained with a case where the redistribution layer 120 is formed on the surface of the semiconductor substrate 110.

Figure 1C:
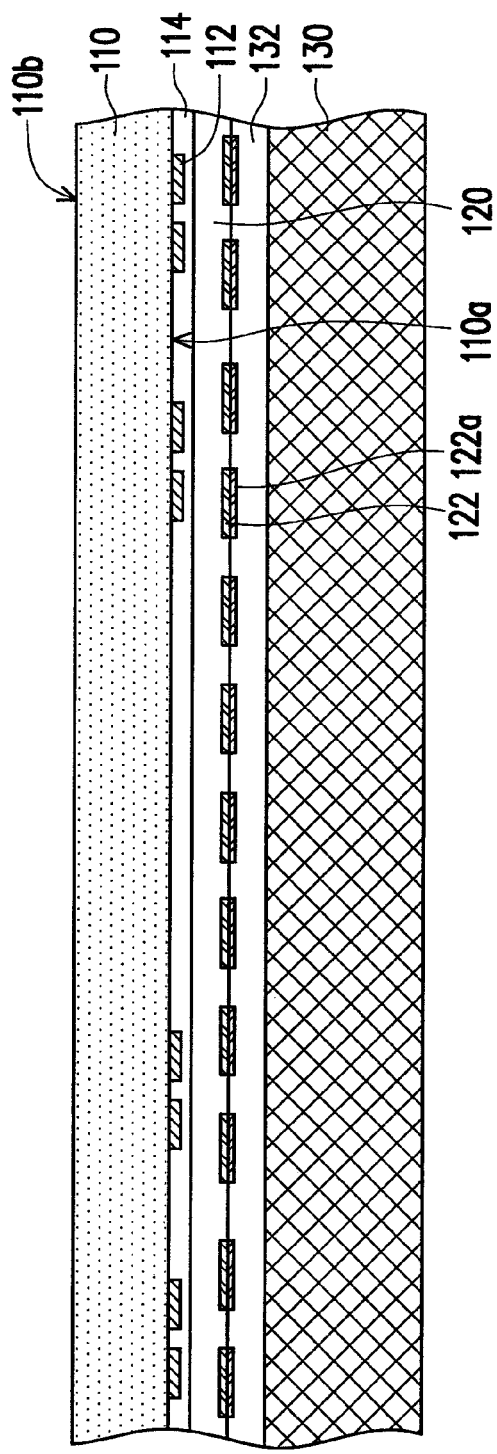

Based on the above, next, as shown in FIG. 1C, the first surface 110a of the semiconductor substrate 110 is faced to a carrier 130 and disposed on the carrier 130. For example, an adhesion layer 132 is coated on the surface of the carrier 130, and the semiconductor substrate 110 is fixed on the carrier 130 by the adhesion layer 132. Herein, the second pads 122 on the surface of the redistribution layer 120 directly contact with the adhesion layer 132. Meanwhile, the semiconductor substrate 110 is thinned from a back side of the semiconductor substrate 110 in opposite to the first surface 110a, such that the thinned semiconductor substrate 110 has a second surface 110b opposite to the first surface 110a.

Figure 1D:
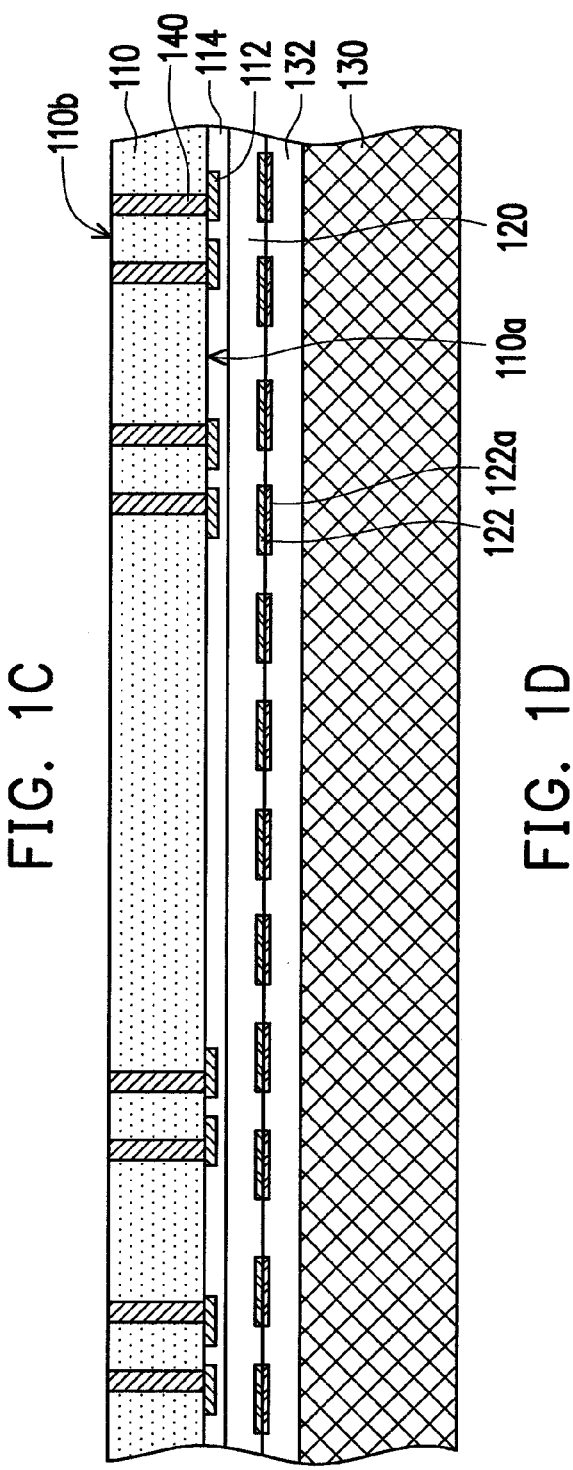

After that, as shown in FIG. 1D, plural through silicon vias (TSVs) 140 are formed in the semiconductor substrate 110. The through silicon vias 140 respectively correspond to and connect to the contacts 112, and respectively connect to the second pads 122 through the internal circuits of the redistribution layer 120.

Figure 1E:
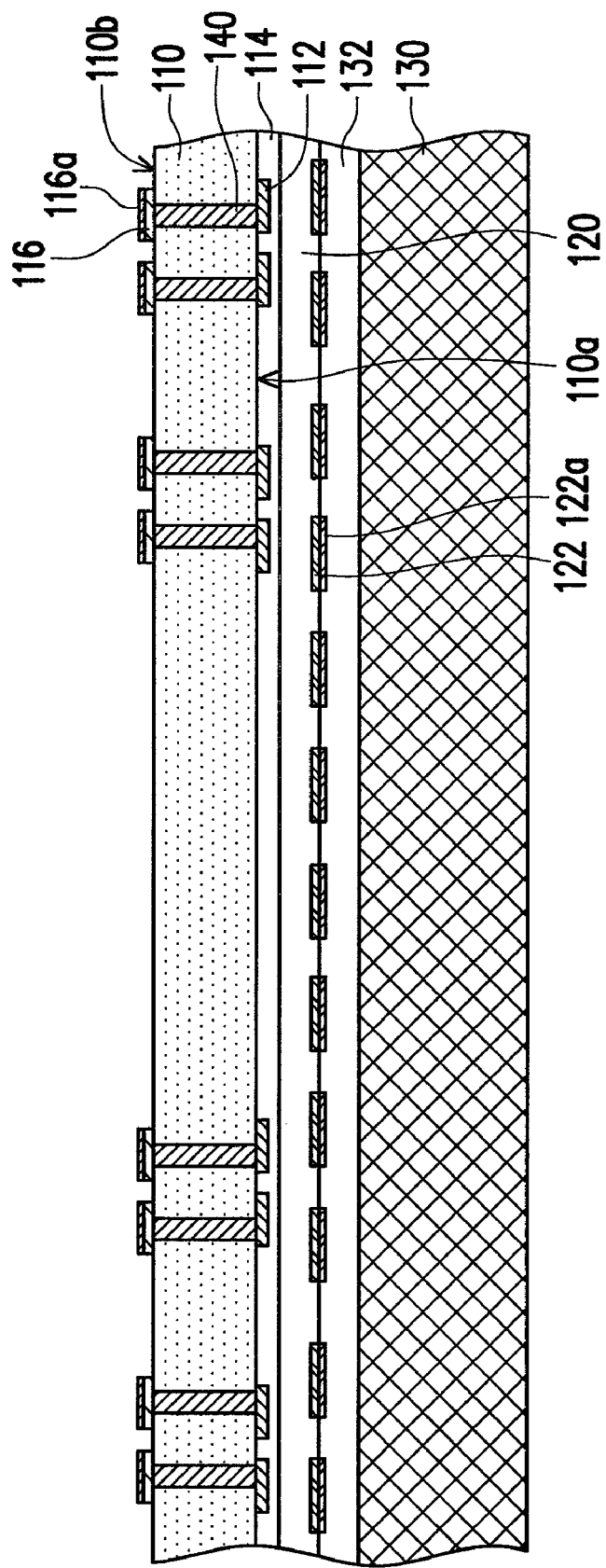

Then, as shown in FIG. 1E, plural first pads 116 are formed on the second surface 110b of the semiconductor substrate 110. The first pads 116 respectively correspond to and connect to the through silicon vias 140. Additionally, an under bump metallurgy layer 116a may be formed selectively on the first pads 116 for increasing an attachment effect between bumps on chips, which are bonded subsequently, and the first pads 116.

Figure 1F:
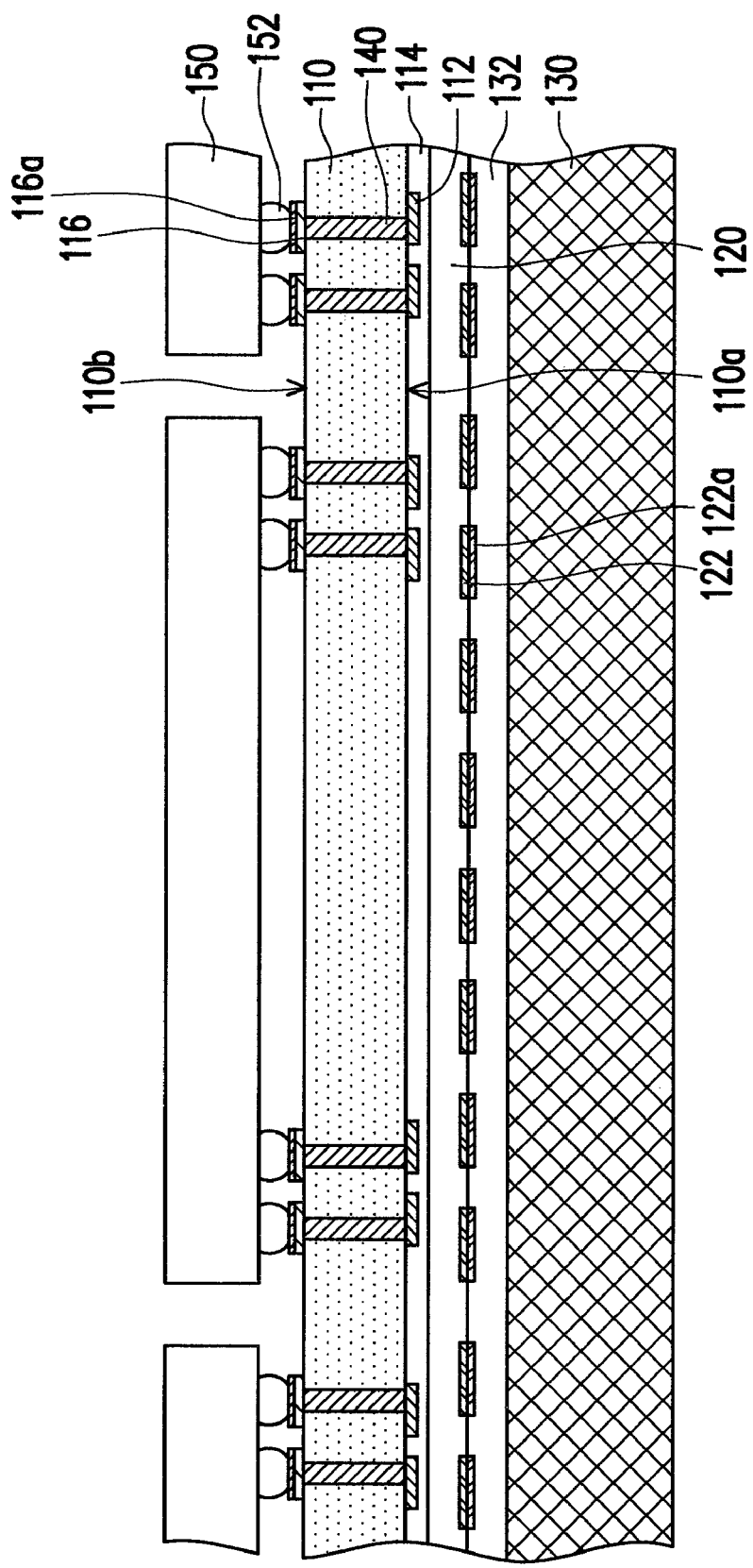

After that, as shown in FIG. 1F, plural chips 150 are bonded to the second surface 110b of the semiconductor substrate 110 such that the chips 150 electrically connect to the first pads 116 on the second surface 110b. In present embodiment, for example, the chips 150 are bonded to the corresponding first pads 116 through plural conductive bumps 152 on the bottom thereof by a flip chip bonding technique, respectively.

Figure 1G:
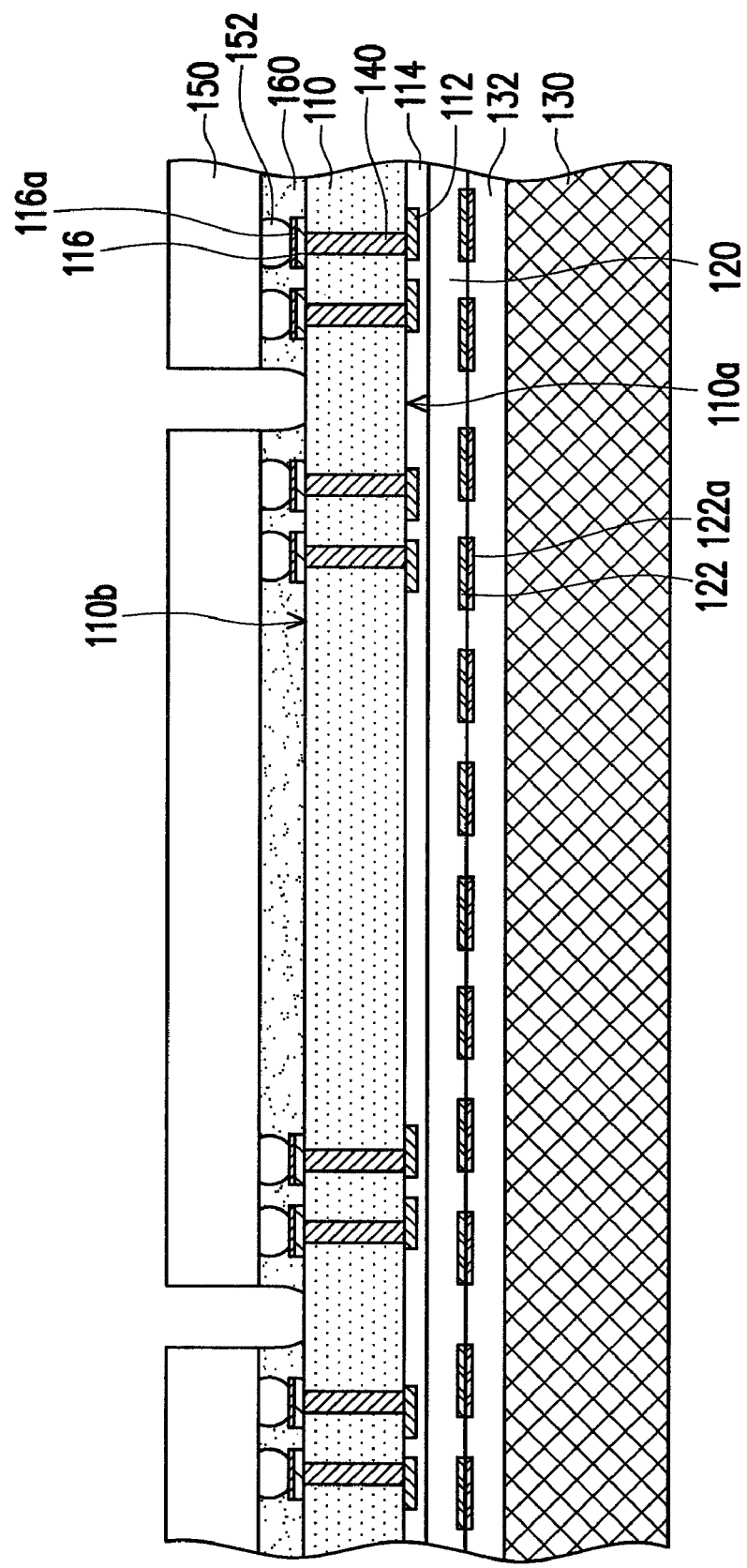

Afterwards, as shown in FIG. 1G, an underfill 160 is formed selectively between the each of the chips 150 and the semiconductor substrate 110 for encapsulating the bumps 152 in the present embodiment. However, the following processes may be performed directly without forming the underfill 160 in another embodiment of the prevent invention.

Figure 1H:
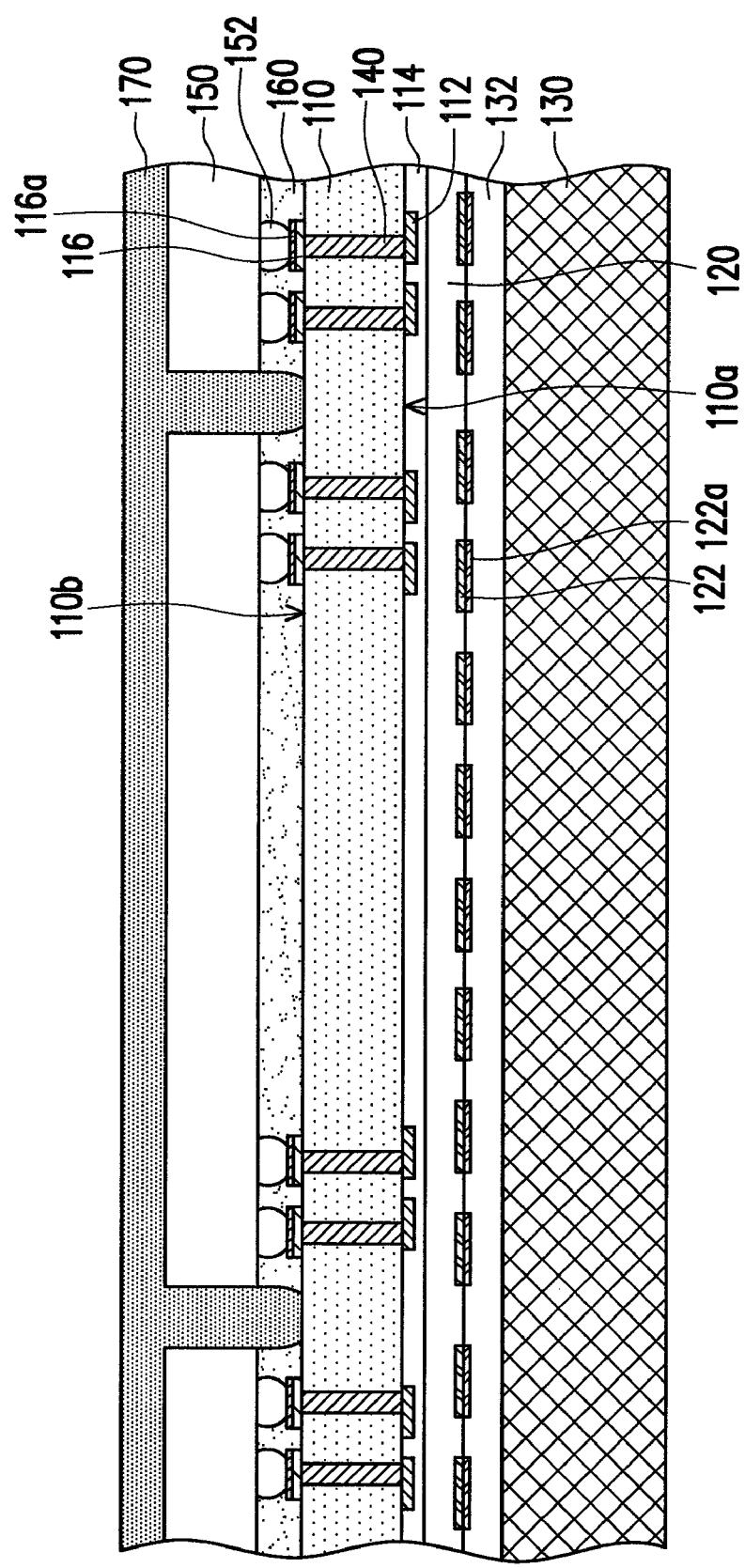

As shown in FIG. 1H, after the chips 150 are bonded to the semiconductor substrate 110, a molding compound 170 is formed on the second surface 110b of the semiconductor substrate 110 for covering all the chips 150, the conductive bumps 152 and the first pads 116 on the semiconductor substrate 110. If the underfill 160 is formed selectively between the chips 150 and the semiconductor substrate 110 before the molding compound 170 is formed in the present embodiment, then the formed molding compound 170 covers the underfill 160. On the other hand, if the step shown in FIG. 1G is not performed in the present embodiment, then the formed molding compound 170 replaces the underfill 160 to directly fill in gaps between the conductive bumps 152.

Figure 1I:
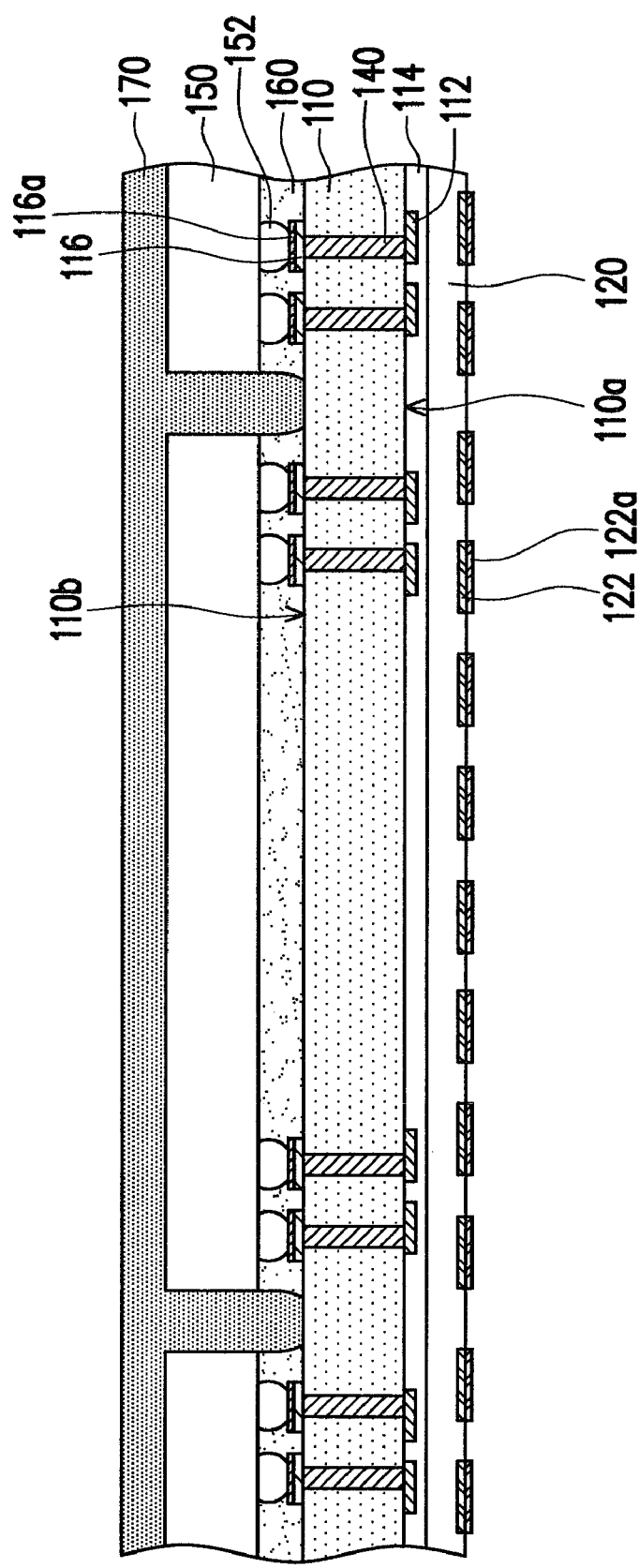
Figure 1J:
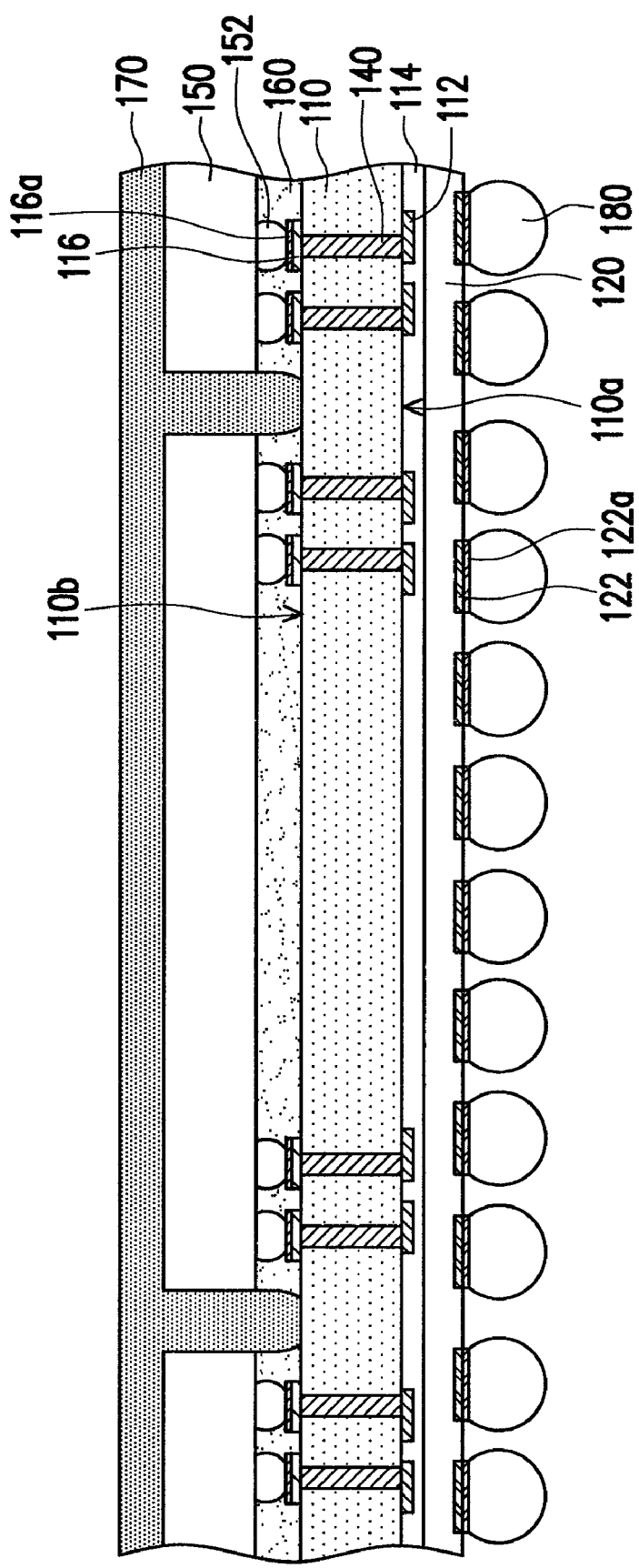

Then, as shown in FIG. 1I, the semiconductor substrate 110 and the carrier 130 are separated to expose the second pads 122 on the redistribution layer 120. And, as shown in FIG. 1J, plural solder balls 180 are formed on the second pads 122 of the redistribution layer 120 for electrically connecting to the corresponding contacts 112 through the redistribution layer 120, respectively, after the semiconductor substrate 110 and the carrier 130 are separated.

Figure 1K:
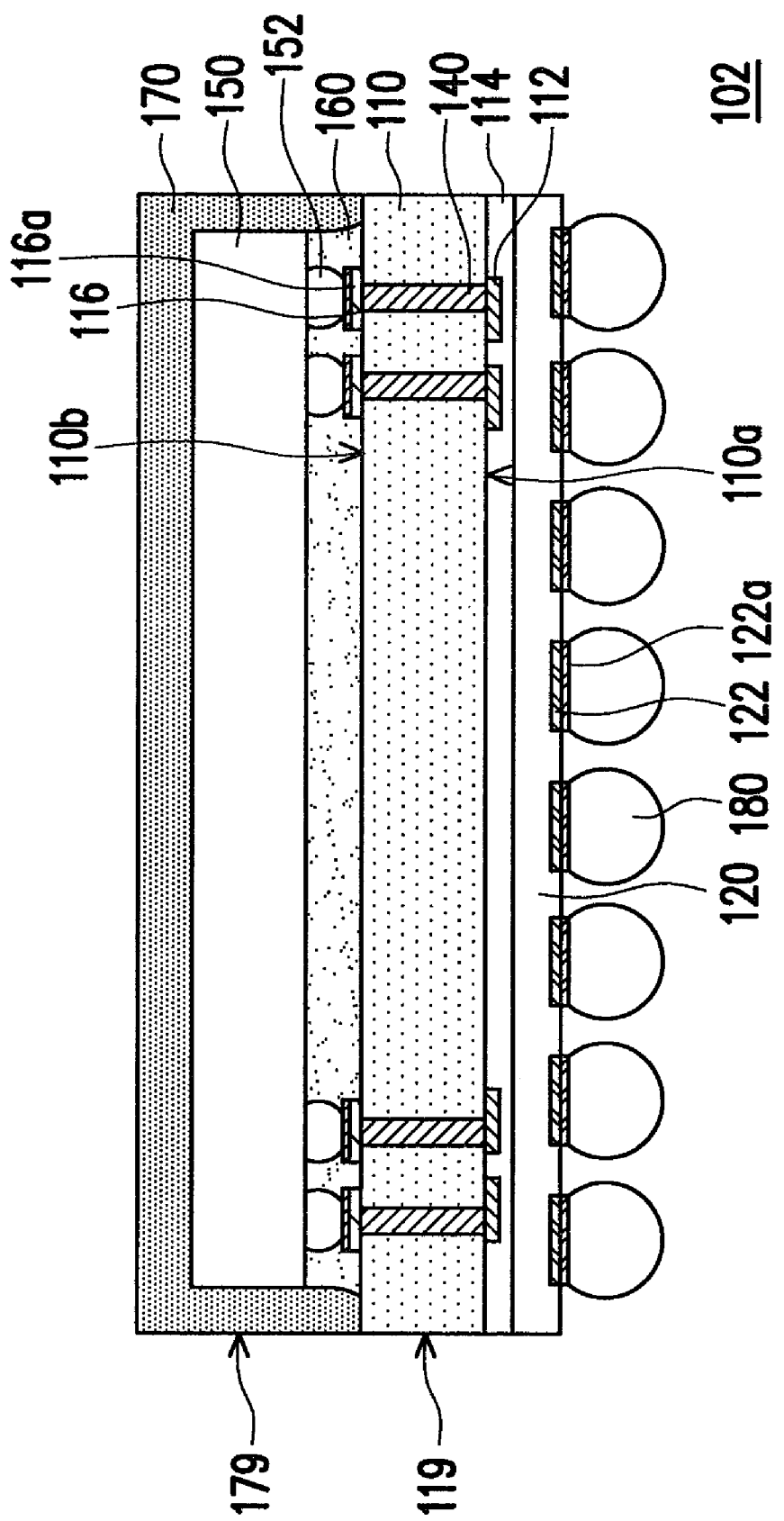

After that, as shown FIG. 1K, a singulation process is executed. That is, the molding compound 170 and the semiconductor substrate 110 are simultaneously sawed to form a plurality of package units 102. Because the molding compound 170 and the semiconductor substrate 110 are simultaneously sawed, a side 179 of the molding compound 170 is aligned to a side 119 of the semiconductor substrate 110, and the chips 150 are encapsulated inside the molding compound 170.

As described above, in the embodiment, the semiconductor substrate 110 first is disposed on the carrier 130, and the solder balls 180 are formed on the first surface 110a of the semiconductor substrate 110 after the steps of the wafer level package, shown in FIGS. 1D~1I, have completed. Therefore, the present embodiment does not need to consider the issue of the bad bonding, which is caused by fabricating the solder ball 180 having a larger size on the bottom of the semiconductor substrate 110, between the semiconductor substrate 110 and the carrier 130, thereby increasing the reliability and the selectivity of the package process.

In the foregoing embodiment, the redistribution layer is formed on the semiconductor substrate before the semiconductor substrate is disposed on the carrier. However, the invention is not limited thereto. For example, in another embodiment of the prevent invention, the redistribution layer may be formed on the semiconductor substrate after the wafer level package has completed and the semiconductor substrate and the carrier are separated. This would be illustrated in the following embodiment.

FIGS. 2A~2K illustrate a package process according to another embodiment of the present invention.

Figure 2A:
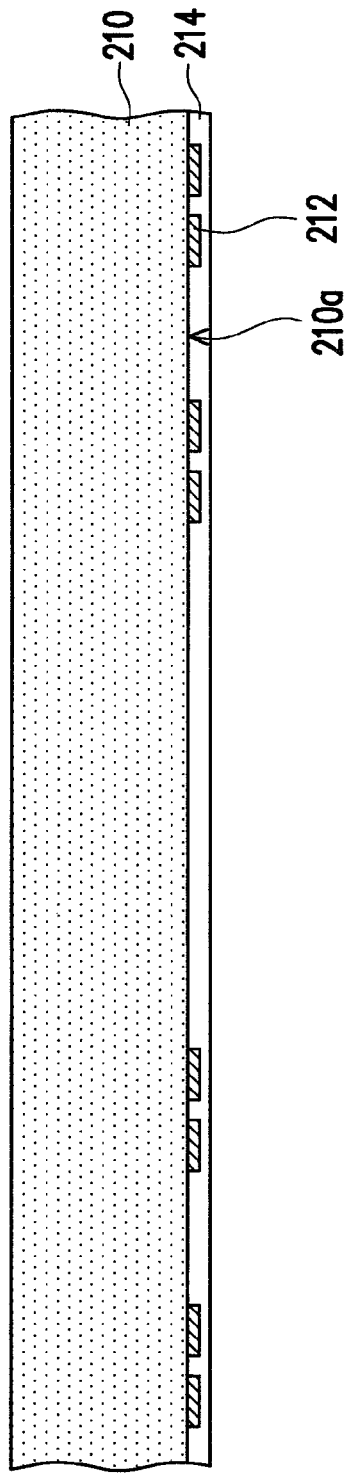

First, referring to FIG. 2A, a semiconductor substrate 210 is provided. The semiconductor substrate may be a silicon wafer substrate or other semiconductor material substrate. The semiconductor substrate 210 has a first surface 210a and a plurality of contacts 212 on the first surface 210a. An interconnect structure may be fabricated inside the semiconductor substrate 210, or active or passive devices (not shown) may be embedded into the semiconductor substrate 210 according to a conventional technique. Additionally, the first surface 210a of the semiconductor substrate 210 may be covered by a passivation layer 214 for protecting the contacts 212.

It should be noted that the semiconductor substrate 210 of the prevent embodiment is used for a carrier of a wafer level package and is packaged with one or more chips. However, because it is limited to the size of the drawings, only a portion of the semiconductor substrate 210 is shown in the present embodiment.

Figure 2B:
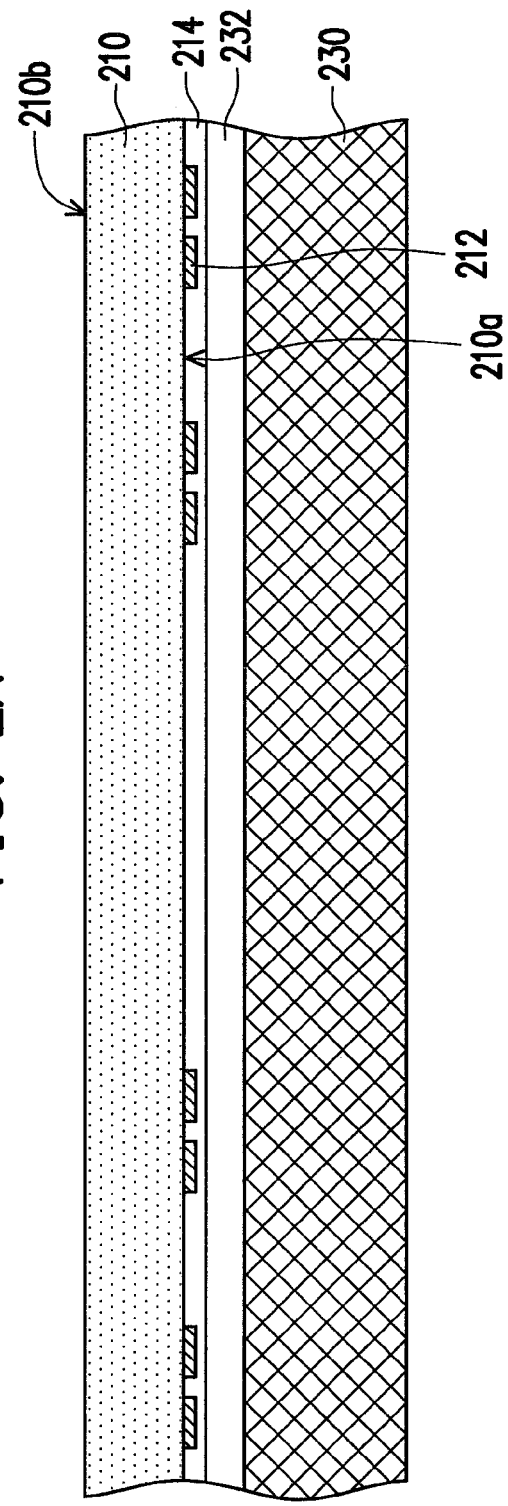

After that, as shown in FIG. 2B, the first surface 210a of the semiconductor substrate 210 is faced to a carrier 230 and disposed on the carrier 230. For example, an adhesion layer 232 is coated on the surface of the carrier 230, and the semiconductor substrate 210 is fixed on the carrier 230 by the adhesion layer 232. Herein, the contacts 212 on the first surface 210a of the semiconductor substrate 210 directly contact with the adhesion layer 232. Meanwhile, the semiconductor substrate 210 is thinned from a back side of the semiconductor substrate 210 in opposite to the first surface 210a, such that the thinned semiconductor substrate 210 has a second surface 210b opposite to the first surface 210a.

After that, as shown in FIG. 2C, plural through silicon vias 240 are formed in the semiconductor substrate 210. The through silicon vias 240 respectively correspond to and connect to the contacts 212.

Then, as shown in FIG. 2D, plural first pads 216 are formed on the second surface 210b of the semiconductor substrate 210. The first pads 216 respectively correspond to and connect to the through silicon vias 240. Additionally, an under bump metallurgy layer 216a may be formed selectively on the first pads 216 for increasing an attachment effect between bumps on chips, which are bonded subsequently, and the first pads 216.

Figure 2E:
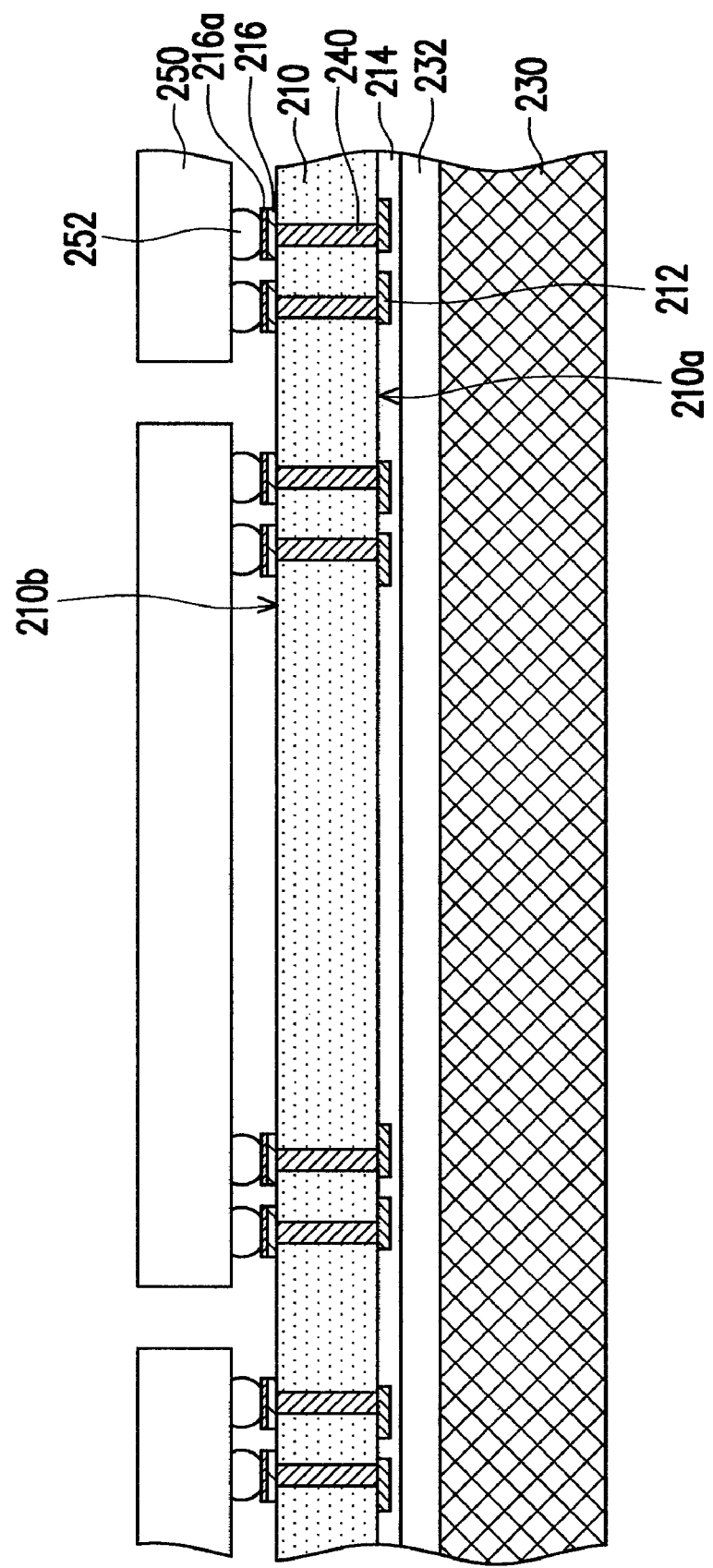

After that, as shown in FIG. 2E, plural chips 250 are bonded to the second surface 210b of the semiconductor substrate 210 such that the chips 250 electrically connect to the first pads 216 on the second surface 210b. In present embodiment, for example, the chips 250 are bonded to the corresponding first pads 216 through plural conductive bumps 252 on the bottom thereof by a flip chip bonding technique, respectively.

Figure 2F:
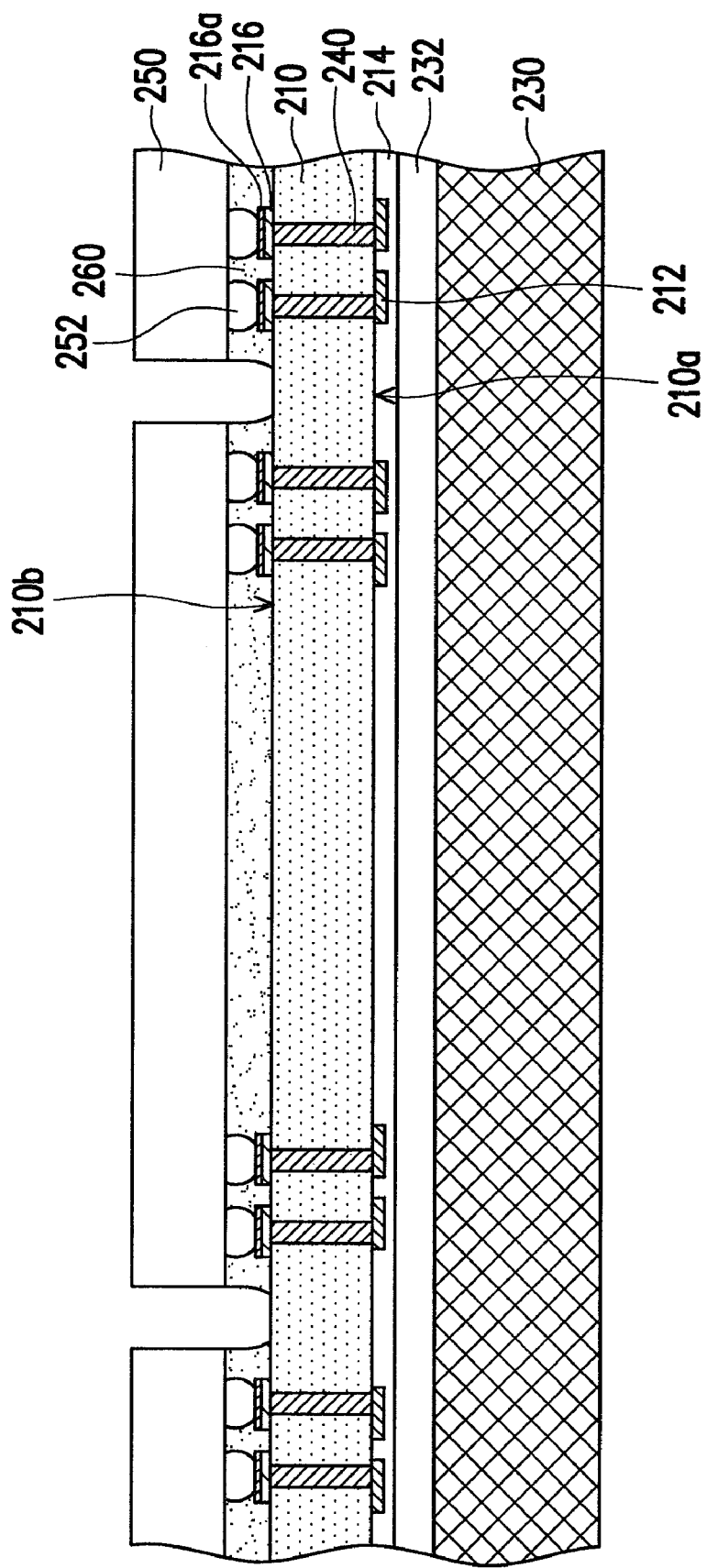

Afterwards, as shown in FIG. 2F, an underfill 260 is formed selectively between the each of the chips 250 and the semiconductor substrate 210 for encapsulating the bumps 252 in the present embodiment. However, the following processes may be executed directly without forming the underfill 160 in another embodiment of the prevent invention.

Figure 2G:
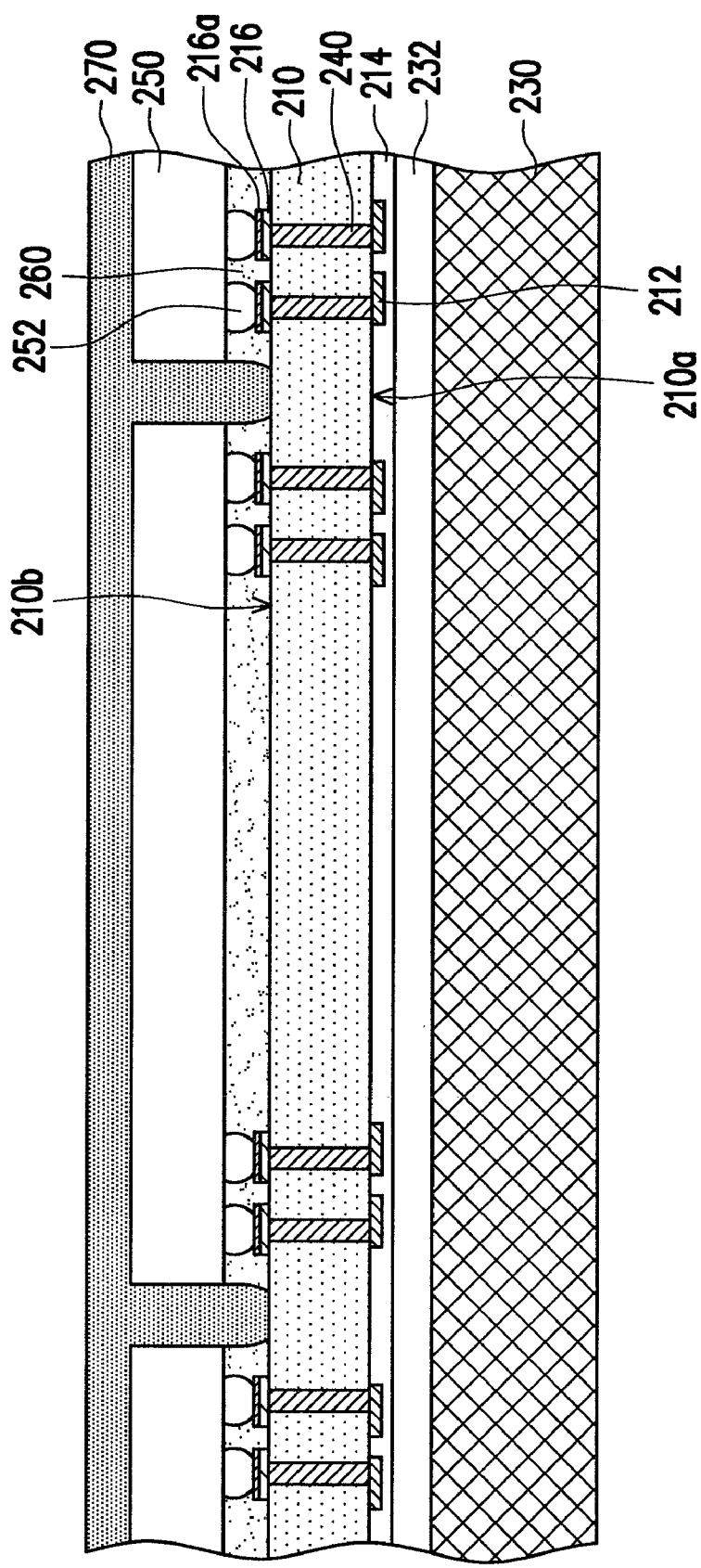

As shown in FIG. 2G, after the chips 250 are bonded to the semiconductor substrate 210, a molding compound 270 is formed on the second surface 210b of the semiconductor substrate 210 for covering the chips 250, the conductive bumps 252 and the first pads 216. If the underfill 260 is formed selectively between the chips 250 and the semiconductor substrate 210 before the molding compound 270 is formed in the present embodiment, then the formed molding compound 270 covers the underfill 260. On the other hand, if the step shown in FIG. 2F is not executed in the present embodiment, then the formed molding compound 270 replaces the underfill 260 to directly fill in gaps between the conductive bumps 252.

Figure 2H:
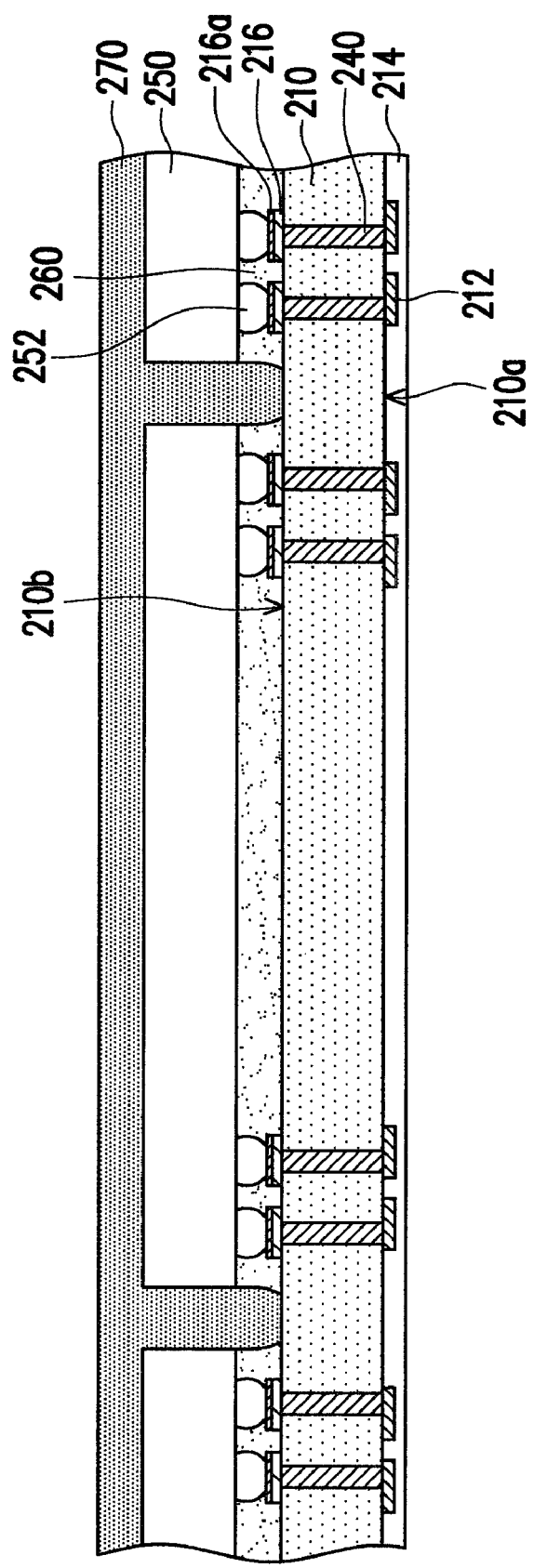
Figure 21:
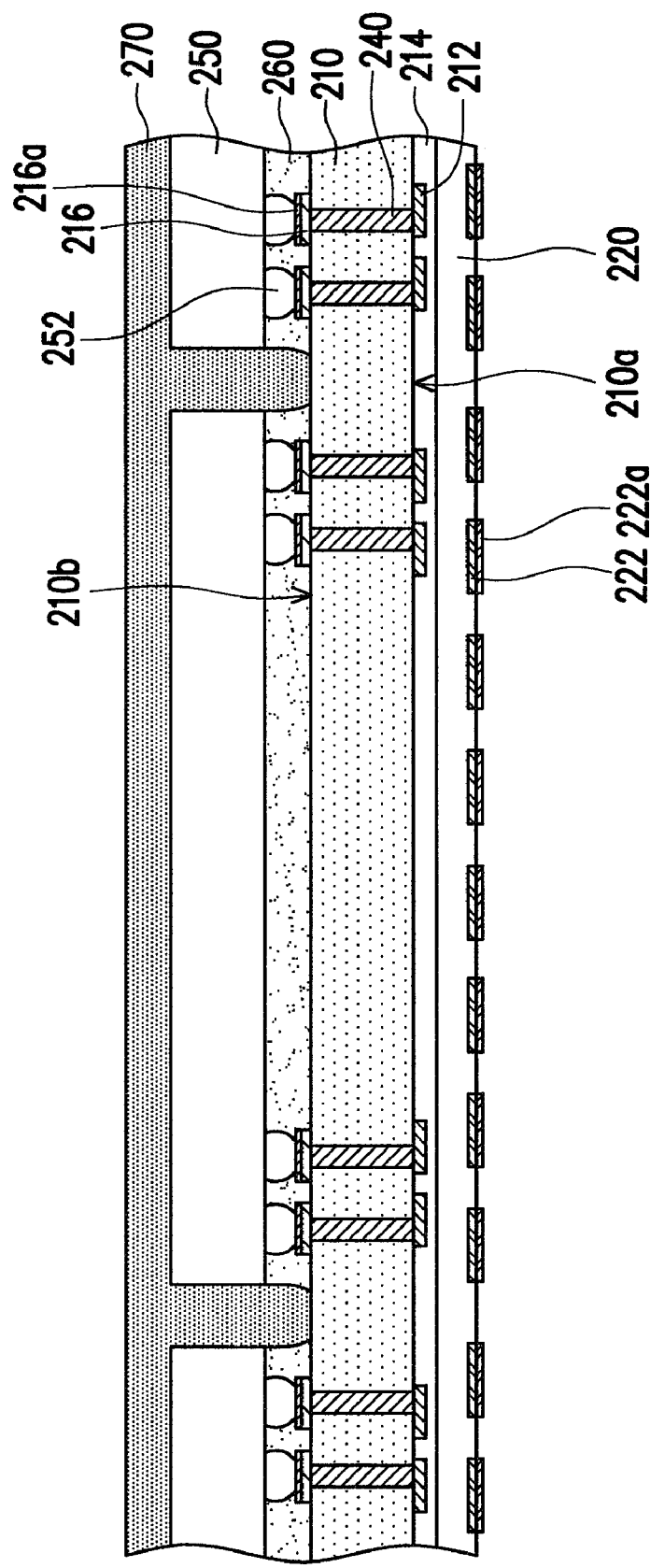

Then, as shown in FIG. 2H, the semiconductor substrate 210 and the carrier 230 are separated to expose the contacts 212 on the first surface 210a of the semiconductor substrate 210. And, as shown in FIG. 2I, in some situations, a redistribution layer 220 may be formed selectively on the first surface 210a of the semiconductor substrate 210, i.e., the passivation layer 214. A surface of the redistribution layer 220 has plural second pads 222, and the second pads 222 electrically connect to the contacts 212 on the first surface 210a of the semiconductor substrate 210 through internal circuits of the redistribution layer 220, respectively, for re-adjusting positions of external contacts of the semiconductor substrate 210. Herein, an under bump metallurgy layer 222a may be formed on the second pads 222 for increasing an attachment effect between solder balls which are formed subsequently and the second pads 222.

The following steps in the embodiment will be explained with a case where the redistribution layer 220 is formed on the surface of the semiconductor substrate 210.

Figure 2J:
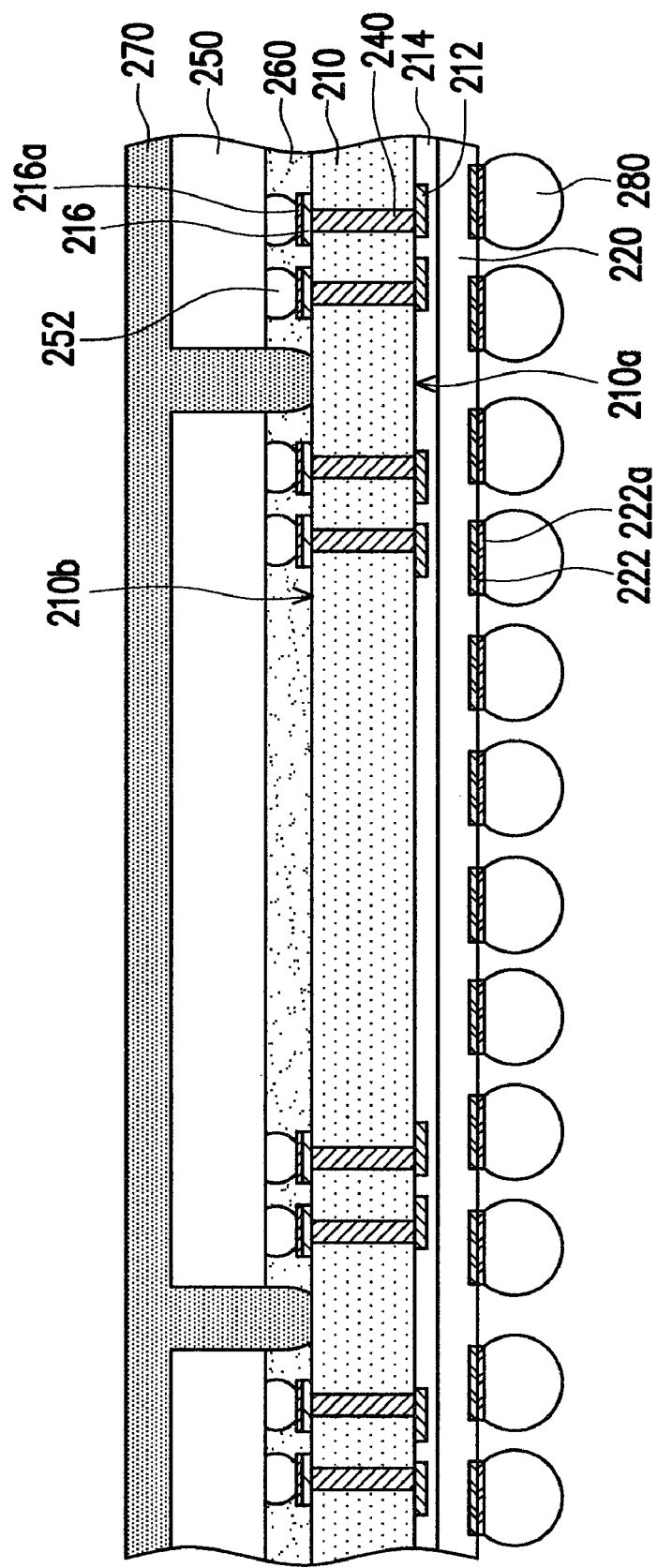

Then, as shown in FIG. 2J, plural solder balls 280 are formed on the second pads 222 of the redistribution layer 220 for electrically connecting to the corresponding contacts 212 through the redistribution layer 220, respectively, after the semiconductor substrate 210 and the carrier 230 are separated.

Figure 2K:
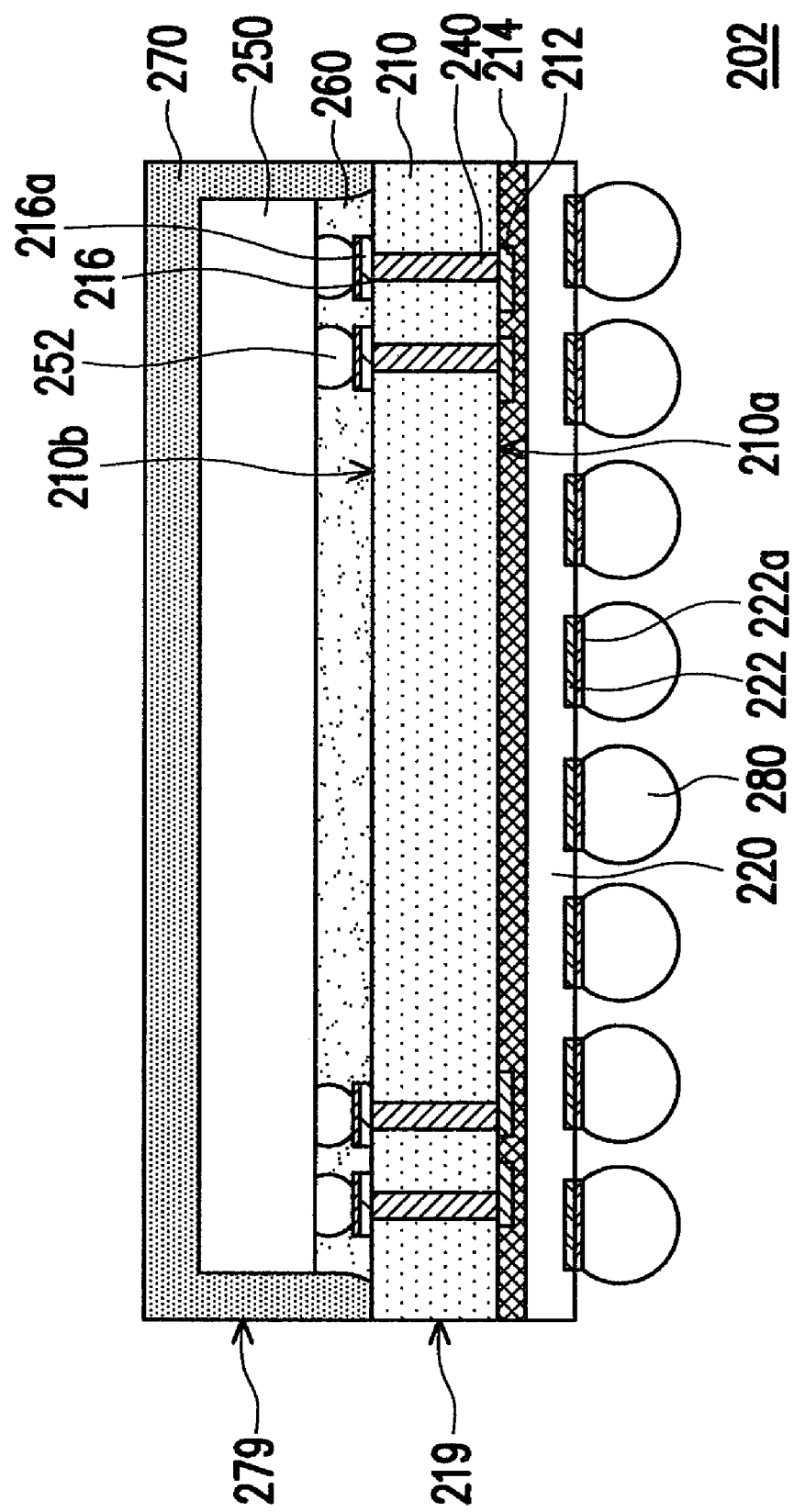

After that, as shown FIG. 2K, a singulation process is executed. That is, the molding compound 270 and the semiconductor substrate 210 are simultaneously sawed to form a plurality of package units 202. Because the molding compound 270 and the semiconductor substrate 210 are simultaneously sawed, a side 279 of the molding compound 270 is aligned to a side 219 of the semiconductor substrate 210, and the chips 250 are encapsulated inside the molding compound 270.

As described above, in the present embodiment, the semiconductor substrate 210 first is disposed on the carrier 230, and then the solder balls 280 are formed on the first surface 210a of the semiconductor substrate 210 after the steps of the wafer level package, shown in FIGS. 2C~2I, have completed. Therefore, the present embodiment does not need to consider the issue of the bad bonding, which is caused by fabricating the solder balls 280 having a larger size on the bottom of the semiconductor substrate 210, between the semiconductor substrate 210 and the carrier 230, thereby increasing the reliability and the selectivity of the package process. On the other hand, compared to the foregoing embodiment, the redistribution layer is formed selectively on the semiconductor substrate after the wafer level package has completed and the semiconductor substrate and the carrier are separated in the present embodiment.

In the foregoing embodiments, the semiconductor substrate first is thinned, and then plural through silicon vias are formed in the semiconductor substrate. However, in another embodiment of the present invention, conductive vias first are formed in the semiconductor substrate and then the semiconductor substrate is thinned, such that conductive vias are exposed from the semiconductor substrate to form a plurality of through silicon vias.

FIGS. 3A~3E illustrate a portion of a package process according to an embodiment of the present invention.

Figure 3A:
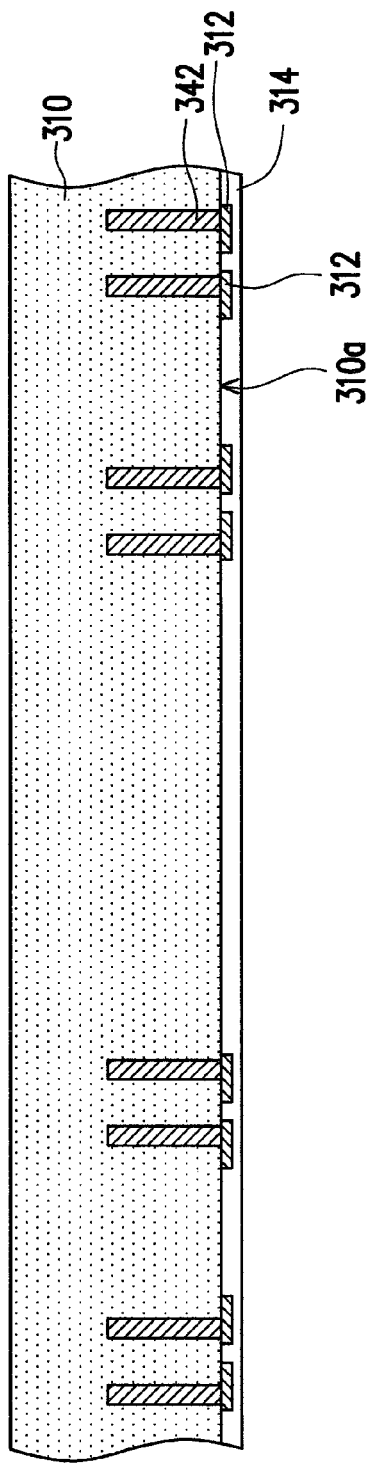
FIGS. 3A~3E illustrate a portion of a package process according to an embodiment of the present invention.

First, referring to FIG. 3A, a semiconductor substrate 310 is provided. The semiconductor substrate may be a silicon wafer substrate or other semiconductor material substrate. The semiconductor substrate 310 has a first surface 310a and plurality of contacts 312 on the first surface 310a. The semiconductor substrate 310 has a plurality of conductive vias 342 inside, and the conductive vias 342 respectively correspond to and connect to the contacts 312. An interconnect structure may be fabricated inside the semiconductor substrate 310, or active or passive devices (not shown) may be embedded into the semiconductor substrate 310 according to a conventional technique. Additionally, the first surface 310a of the semiconductor substrate 310 may be covered by a passivation layer 314 for protecting the contacts 312.

It should be noted that the semiconductor substrate 310 of the prevent embodiment is used for a carrier of a wafer level package and is packaged with one or more chips. However, because it is limited to the size of the drawings, only a portion of the semiconductor substrate 310 is shown in the present embodiment.

Figure 3B:
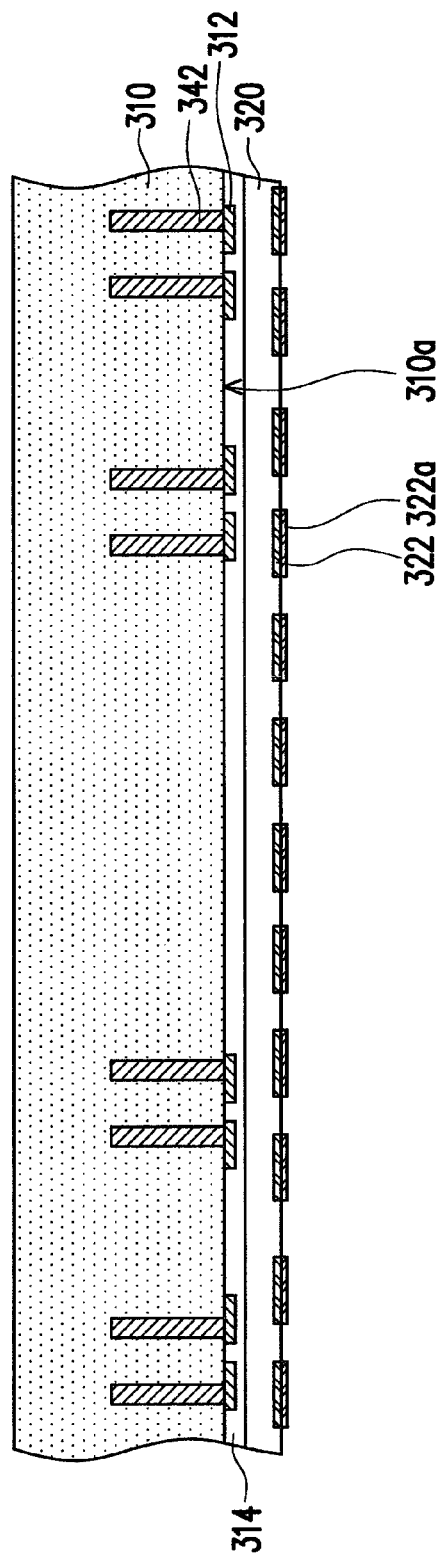

Then, as shown in FIG. 3B, a redistribution layer 320 may be formed on the first surface 310a of the semiconductor substrate 310, i.e., the passivation layer 314, selectively. A surface of the redistribution layer 320 has plural pads 322, and the pads 322 electrically connect to the contacts 312 on the first surface 310a of the semiconductor substrate 310 through internal circuits of the redistribution layer 320, respectively, for re-adjusting positions of external contacts of the semiconductor substrate 310. Herein, an under bump metallurgy layer 322a may be formed on the pads 322 for increasing an attachment effect between solder balls, which are formed subsequently, and the pads 322.

The following steps in the embodiment will be explained with a case where the redistribution layer 320 is formed on the surface of the semiconductor substrate 310.

Figure 3C:
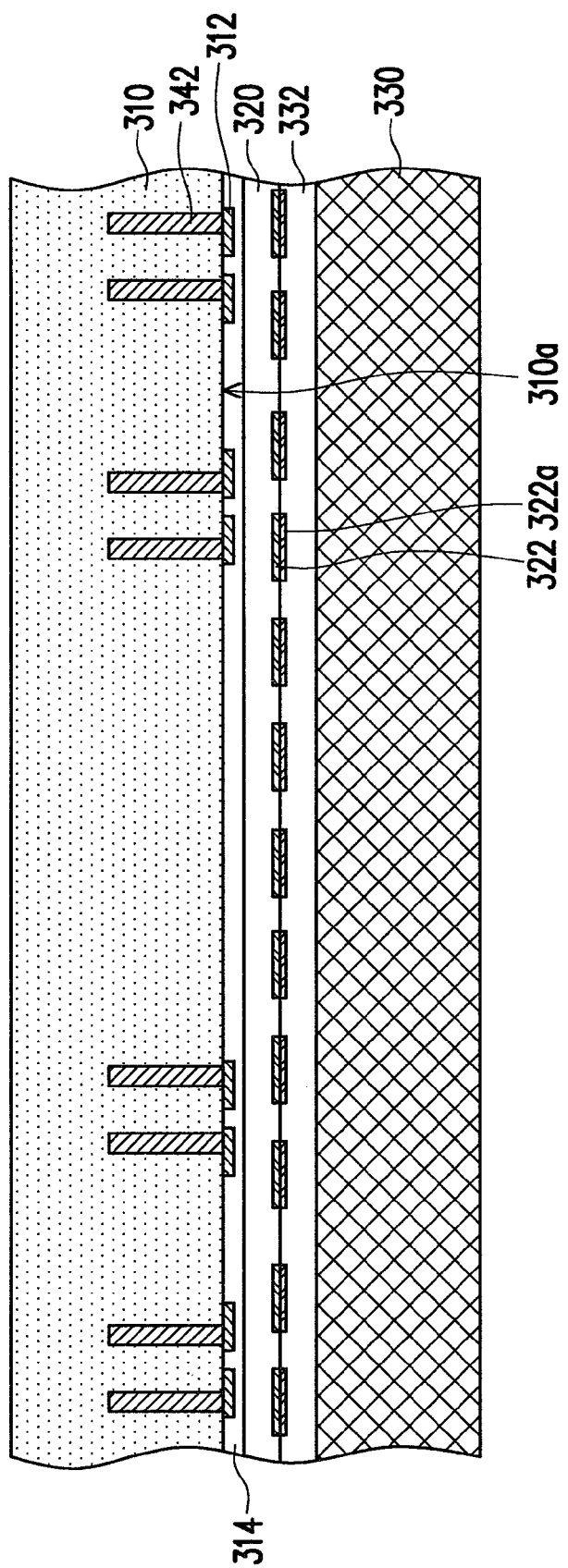

Based on the above, next, as shown in FIG. 3C, the first surface 310a of the semiconductor substrate 310 is faced to a carrier 330 and disposed on the carrier 330. For example, an adhesion layer 332 is coated on the surface of the carrier 330, and the semiconductor substrate 310 is fixed on the carrier 330 by the adhesion layer 332. Herein, the pads 322 on the redistribution layer 320 directly contact with the adhesion layer 332.

Figure 3D:
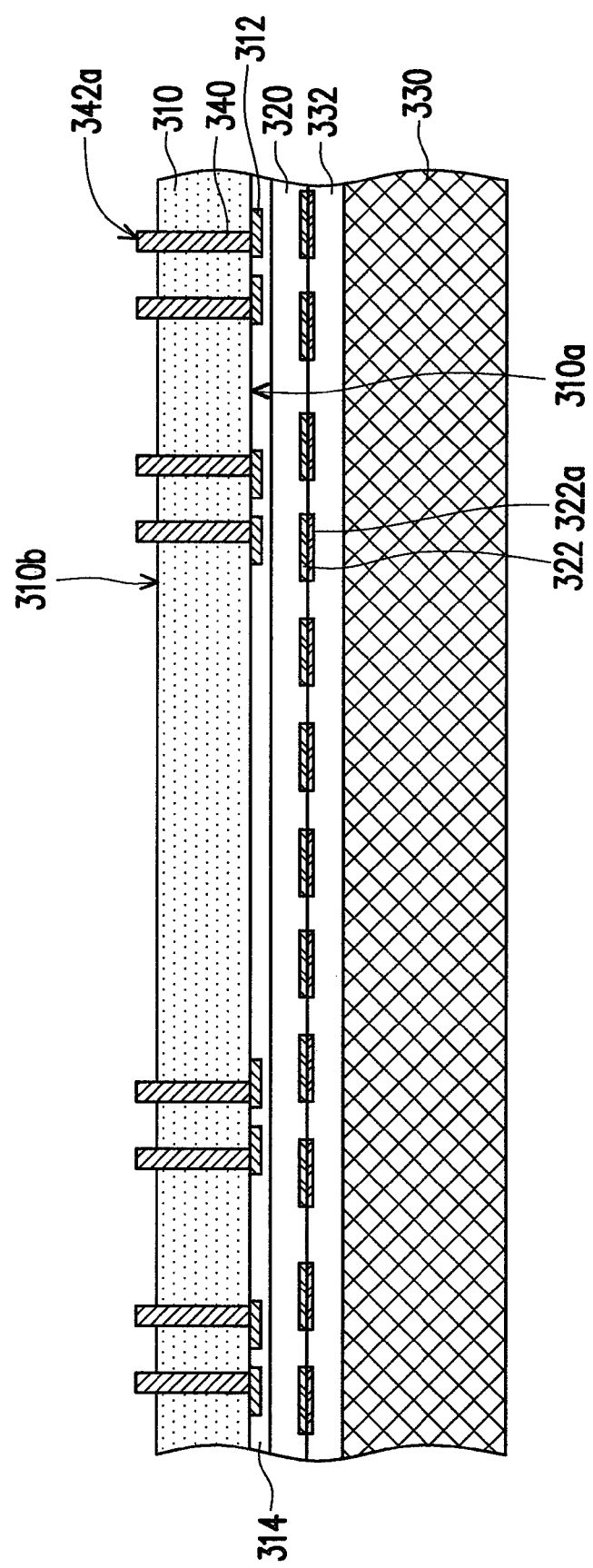

And, as shown in FIG. 3D, the semiconductor substrate 310 is thinned from a back side of the semiconductor substrate 310 in opposite to the first surface 310a, wherein the thinned semiconductor substrate 310 has a second surface 310b opposite to the first surface 310a and a terminal 342a of each of the conductive vias 342 protrudes from the second surface 310b to form a through silicon via 340. The through silicon vias 340 respectively connect to the pads 322 through internal circuits of the redistribution layer 320.

Figure 3E:
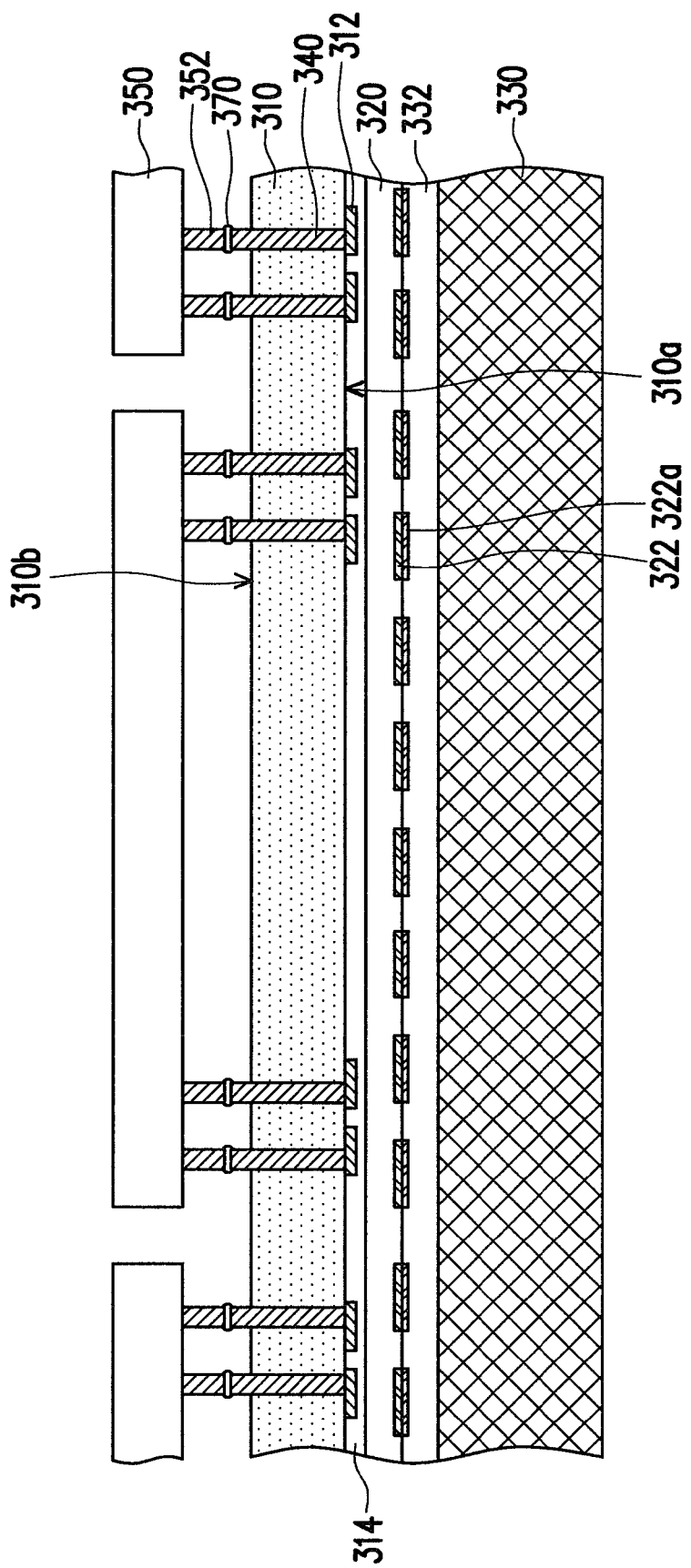

Then, as shown in FIG. 3E, a plurality of chips 350 are bonded to the exposed through silicon vias 340. In present embodiment, for example, the chips 350 are bonded to the corresponding through silicon vias 340 through plural conductive bumps 352 on the bottom thereof by a flip chip bonding technique, respectively. For example, the conductive bumps 352 connect to the corresponding through silicon vias 340 through solder 370. The conductive bumps 352 may be cylindrical bumps as shown in FIG. 1D or other types.

Afterwards, the steps as shown in FIG. 1G~1K are executed to form the package units 102 as shown in FIG. 1K. The technology details have been described in the embodiments described above so the details will not be described here again.

Additionally, referring to FIG. 2A~2K, besides the technology solution in which the redistribution layer is formed on the semiconductor substrate before the semiconductor substrate is disposed on the carrier, the redistribution layer may formed on the semiconductor substrate with the foregoing method of fabricating the through silicon vias after the wafer level package has completed and the semiconductor substrate and the carrier are separated in another embodiment of the present invention.

Although the invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A package process, comprising:
   disposing a semiconductor substrate on a carrier, wherein the semiconductor substrate has a first surface facing the carrier and plural contacts on the first surface, and the semiconductor substrate is bonded to the carrier with a passivation layer on the first surface;
   thinning the semiconductor substrate from a back side of the semiconductor substrate in opposite to the first surface, wherein the thinned semiconductor substrate has a second surface opposite to the first surface;
   forming plural through silicon vias in the thinned semiconductor substrate, wherein the through silicon vias respectively correspond to and connect to the contacts;
   forming plural first pads on the second surface of the semiconductor substrate, wherein the first pads respectively correspond to and connect to the through silicon vias;
   bonding plural chips to the second surface of the semiconductor substrate, wherein the chips respectively electrically connect to the corresponding first pads;
   forming a molding compound on the second surface of the semiconductor substrate, wherein the molding compound covers the chips and the first pads;
   separating the semiconductor substrate and the carrier, wherein the passivation layer is remained on the first surface of the semiconductor substrate;

forming a redistribution layer on the passivation layer after the semiconductor substrate and the carrier are separated, wherein a surface of the redistribution layer has plural second pads, and the second pads respectively electrically connect to the contacts;

forming plural solder balls on the first surface of the semiconductor substrate, wherein the solder balls respectively electrically connect to the corresponding contacts; and simultaneously sawing the molding compound and the semiconductor substrate to form a plurality of package units.

2. The package process according to claim 1, further comprising:

forming an under bump metallurgy layer on each of the second pads.

3. The package process according to claim 1, further comprising:

forming an under bump metallurgy layer on each of the first pads.

4. The package process as claimed in claim 1, wherein the step of bonding the chips to the second surface of the semiconductor substrate includes bonding each of the chips to the corresponding first pads through plural conductive bumps by a flip chip bonding technique.

5. The package process according to claim 4, further comprising:

forming an underfill between each of the chips and the semiconductor substrate after the chips are bonded to the second surface of the semiconductor substrate and before the molding compound is formed on the second surface of the semiconductor substrate, wherein the underfill encapsulates the conductive bumps.

6. The package process as claimed in claim 2, further comprising:

forming a solder ball on each of the under bump metallurgy layer.

7. The package process as claimed in claim 1, wherein the molding compound directly fill in a gap between the chips and the semiconductor substrate.

8. The package process according to claim 1, further comprising:

forming an under bump metallurgy layer on each of the first pads.

* * * * *